(12) United States Patent
Fay et al.

(10) Patent No.: US 9,601,374 B2
(45) Date of Patent: Mar. 21, 2017

(54) SEMICONDUCTOR DIE ASSEMBLY

(71) Applicant: Micron Technology, Inc., Boise, ID (US)

(72) Inventors: Owen R. Fay, Meridian, ID (US); Liana Foster, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 14/669,780

(22) Filed: Mar. 26, 2015

(65) Prior Publication Data

US 2016/0284675 A1 Sep. 29, 2016

(51) Int. Cl.
| | |
|---|---|
| *H01L 25/065* | (2006.01) |
| *H01L 21/78* | (2006.01) |
| *H01L 25/00* | (2006.01) |
| *H01L 25/18* | (2006.01) |

(52) U.S. Cl.
CPC .......... *H01L 21/78* (2013.01); *H01L 25/0657* (2013.01); *H01L 25/18* (2013.01); *H01L 25/50* (2013.01); *H01L 2224/0401* (2013.01); *H01L 2224/04042* (2013.01); *H01L 2224/32225* (2013.01); *H01L 2224/73204* (2013.01); *H01L 2224/73253* (2013.01); *H01L 2224/73265* (2013.01); *H01L 2225/0651* (2013.01); *H01L 2225/06513* (2013.01); *H01L 2225/06558* (2013.01); *H01L 2924/1431* (2013.01); *H01L 2924/1434* (2013.01); *H01L 2924/18161* (2013.01)

(58) Field of Classification Search
CPC .............................................. H01L 2225/1052
See application file for complete search history.

(56) References Cited

U.S. PATENT DOCUMENTS

| | | | | |
|---|---|---|---|---|
| 6,555,917 | B1 * | 4/2003 | Heo | H01L 23/3128 257/685 |
| 7,105,930 | B2 * | 9/2006 | Lua | H01L 21/563 257/738 |
| 7,119,427 | B2 * | 10/2006 | Kim | H01L 23/5387 257/686 |
| 7,847,398 | B2 * | 12/2010 | Na | H01L 23/49838 257/737 |
| 8,384,200 | B2 * | 2/2013 | Seng | H01L 25/0657 257/686 |
| 8,680,654 | B2 | 3/2014 | Fay et al. | |
| 2005/0045378 | A1 * | 3/2005 | Heng | H01L 25/0657 174/260 |
| 2005/0052830 | A1 * | 3/2005 | Bauer | H01L 24/97 361/679.02 |
| 2007/0235871 | A1 * | 10/2007 | Huang | H01L 23/13 257/737 |
| 2008/0136027 | A1 * | 6/2008 | Moon | H01L 23/4952 257/738 |

(Continued)

*Primary Examiner* — Lex Malsawma
(74) *Attorney, Agent, or Firm* — Brooks, Cameron & Huebsch, PLLC (57) ABSTRACT

A semiconductor die assembly having a solderball wire-bonded to a substrate. As an example, the semiconductor die assembly may include the solderball attached to a bond pad on a face surface of a memory die. A non-face surface of the memory die can be attached to the substrate. A wire can be wirebonded to the solderball at a first end of the wire and connected to the substrate at a second end of the wire.

27 Claims, 4 Drawing Sheets (56) References Cited

U.S. PATENT DOCUMENTS

| | | | |
|---|---|---|---|
| 2008/0179745 A1* | 7/2008 | Hess | H01L 24/05 257/751 |
| 2010/0176508 A1* | 7/2010 | Herbsommer | H01L 23/4334 257/718 |
| 2011/0309496 A1* | 12/2011 | Wang | H01L 23/3121 257/737 |
| 2013/0119528 A1 | 5/2013 | Groothuis et al. | |
| 2014/0291834 A1 | 10/2014 | Gandhi et al. | |

* cited by examiner

SEMICONDUCTOR DIE ASSEMBLY

TECHNICAL FIELD

The present disclosure relates generally to semiconductor devices and methods, and more particularly to semiconductor die assemblies and their connections to substrates.

BACKGROUND

A semiconductor device can include at least one semiconductor die (e.g., semiconductor die assembly) coupled to a substrate through a plurality of conductive structures (e.g., metals, wires, conductive lines, solderbumps, etc.). The semiconductor die can include a semiconductor mounted to a substrate and encased in a plastic protective covering. The semiconductor die can include functional features, such as memory cells, processor circuits, imager components, and interconnecting circuitry. The semiconductor die may be a plurality of memory die, and the substrate may be a logic die or an organic or inorganic substrate. The die can include bond pads electrically coupled to the functional features. The bond pads can be electrically connected to pins and/or other types of terminals that extend outside the protective covering for connecting the die to busses, circuits, and/or other microelectronic assemblies. Semiconductor die assemblies can be used in a variety of electronic applications, such as personal computers, cell phones, digital cameras, and other electronic devices.

DETAILED DESCRIPTION

A process for forming a semiconductor device can utilize a substrate, such as a wafer formed of a semiconductor material, e.g., silicon. A layer of photoresist can be applied to a processing surface on which circuitry is to be performed. As used herein, a processing surface on which the circuitry is formed is also referred to as the "face" surface of the wafer. Thereafter, the water can be patterned. Subsequent to an etching process, such as a deep reactive-ion etching process, to create vias in the patterned wafer, the layer of photoresist can be removed and the wafer can be mounted on a wafer holder. The wafer can be mounted to a wafer holder by utilizing a temporary adhesive such as a glue. An under bump metallization (UBM) can be formed on a surface of the semiconductor device. The UBMs can be utilized to electrically connect the semiconductor device to a number of other semiconductor devices and/or other components of an electronic device.

Figure 1A:
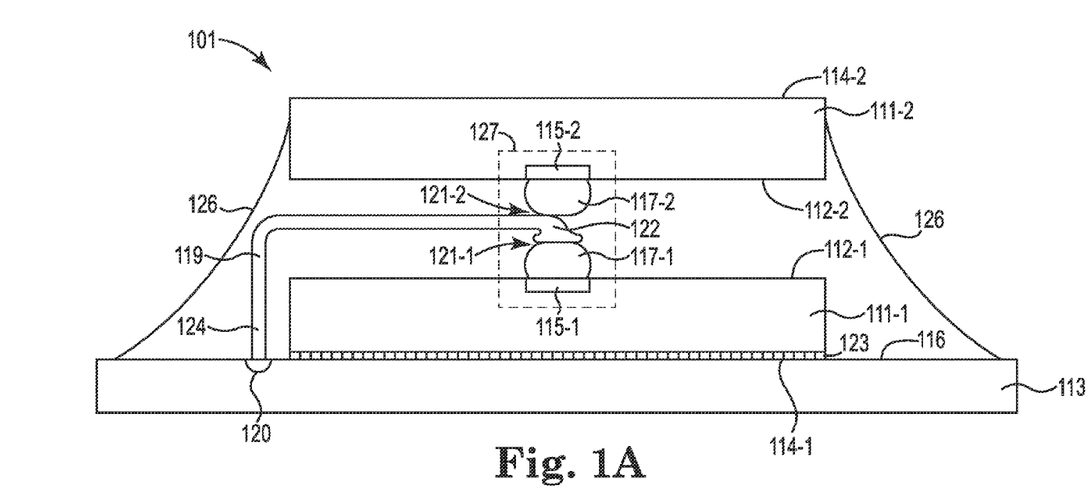
FIG. 1A is an example of a semiconductor die assembly in accordance with a number of embodiments of the present disclosure.
Figure 1B:
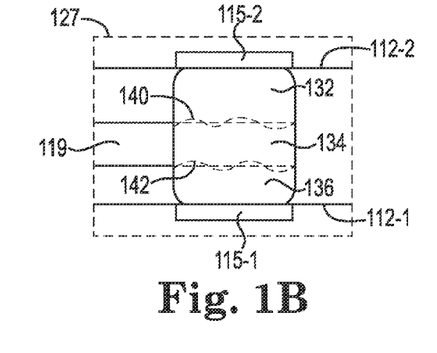
FIG. 1B is an example of a portion of a semiconductor die assembly in accordance with a number of embodiments of the present disclosure.
Figure 2:
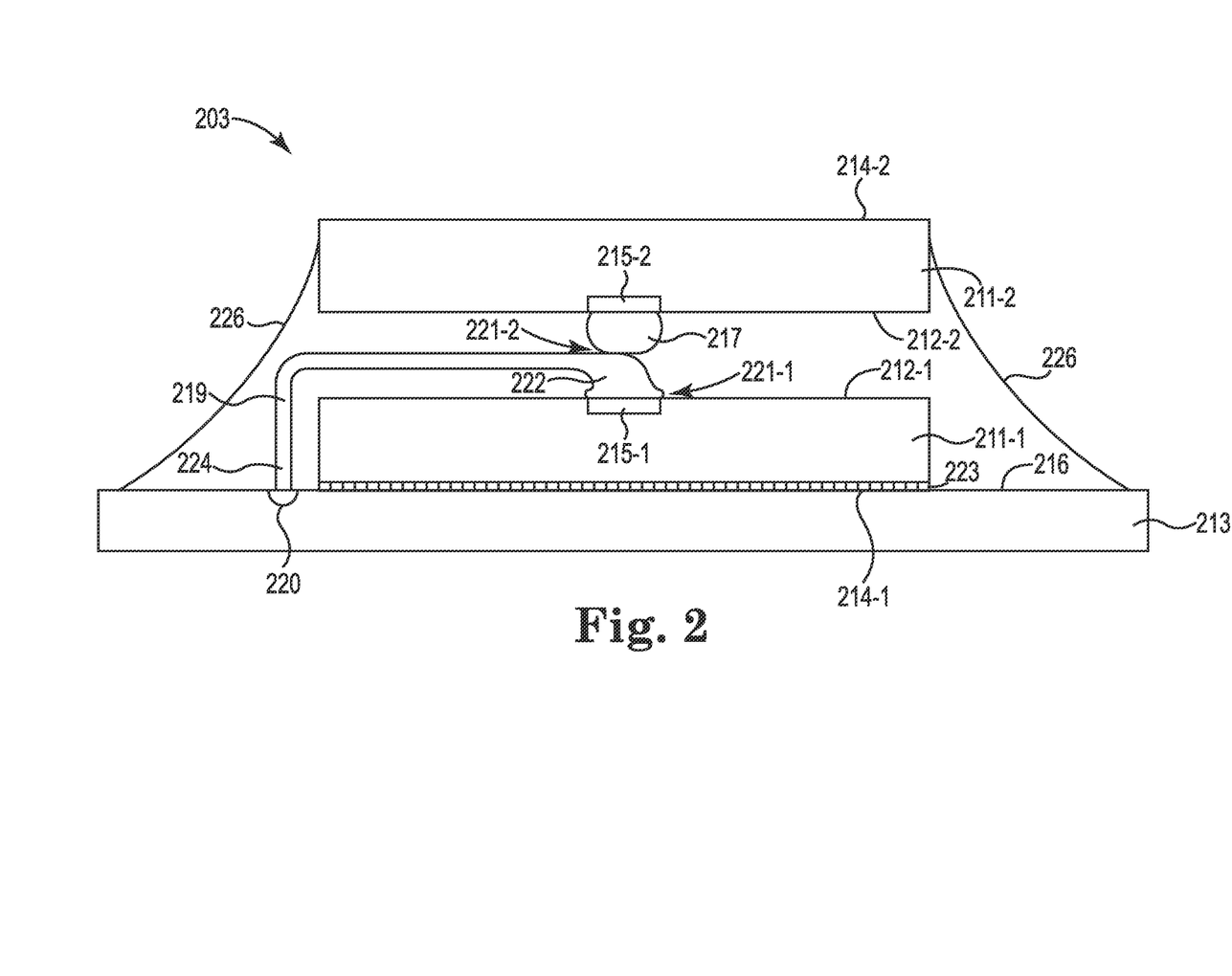
FIG. 2 is an example of a semiconductor die assembly in accordance with a number of embodiments of the present disclosure.
Figure 3:
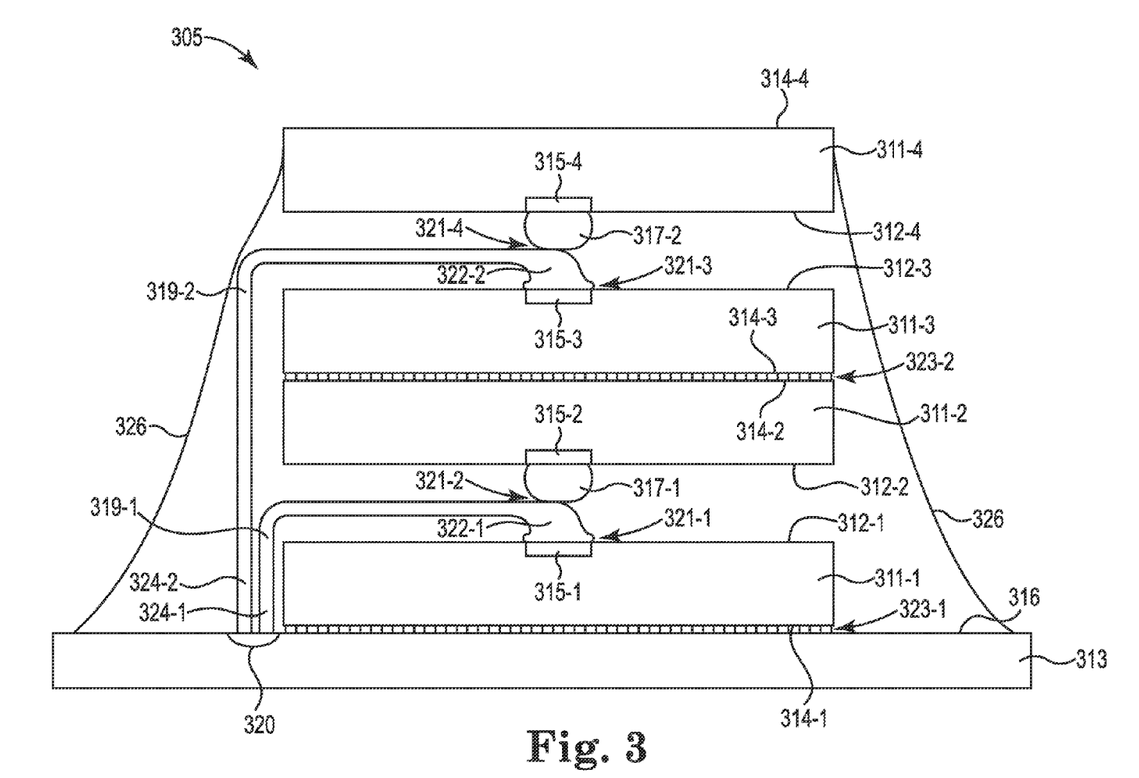
FIG. 3 is an example of a semiconductor die assembly in accordance with a number of embodiments of the present disclosure.

After formation of the UBMs, the wafers can be cut to form a number of relatively smaller semiconductor devices, e.g. semiconductor die assemblies including memory dies. Semiconductor die assemblies can be connected to a substrate by use of wirebonding and methods of forming the same are described herein. A semiconductor die can include a number of articles of manufacture, including, for example, integrated circuit (IC) dies, imager dies, sensor dies, and/or dies having other semiconductor features. While a number of examples of semiconductor die assemblies are illustrated in FIGS. 1-3, examples are not so limited. Components and/or features can be altered and/or modified in a number of ways.

A semiconductor die assembly can include a bond pad for connecting to a memory die. A bond pad is a pad that can be used to connect a circuit on a die to a pin on a packaged chip. The bond pad can be on a face surface of a memory die. A face surface of a memory die can refer to a surface of the memory die including bond pads to be connected (e.g., electrically connected) to a substrate. An interconnect structure (e.g., a solderball, a copper pillar bump, a gold bump, etc.) can be attached to the bond pad on the face surface of the memory die. A solderball and/or a copper pillar bump can be an electroplated structure. That is, a coating can be formed using an electrolytic deposition with copper, nickel, tin-silver, silver, old, or another metal, including alloys of the listed metals, to form a solderball and/or a pillar bump. A non-face surface of the memory die (e.g., surface without a bond pad) can be adhered (e.g., adhesively) to a substrate.

A wire (e.g., a wire consisting of at least one of gold (Au), silver (Ag), copper (Cu)) can be wirebonded to the solderball at a first end of the wire and connected to the substrate at a second end of the wire. Wirebonding can provide a method for making interconnections between an integrated circuit (IC) (and/or other semiconductor devices) and packaging during semiconductor device fabrication. Wirebonding can also connect an IC to other electronics or one printed circuit board (PCB) to another PCB. In some examples, wirebonding can be used along with a flip chip method of connecting a first memory die to a second memory die. The first memory die and the second memory die can be connected in a face-to-face configuration. That is, the face surface of the first memory die is connected to the face surface of the second memory die (e.g., the second memory die is 'flipped' and connected to the face (e.g., top) surface of the first memory die).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 111 may reference element "11" in FIG. 1A, and a similar element may be referenced as 211 in FIG. 2. Also, as used herein, "a number of" a particular element and/or feature can refer to one or more of such elements and/or features.

FIG. 1A is an example of a semiconductor die assembly 101 in accordance with a number of embodiments of the present disclosure. Semiconductor die assembly 101 can include a number of memory dies, e.g., a first memory die 111-1 and a second memory die 111-2. Memory die 111-1 can be attached (e.g., using a die attach adhesive) to substrate 113. A die attach adhesive can include a compliant layer adhesive, flexible die-attach film and/or paste adhesives. Substrate 113 can include a semiconductor material, such as a printed circuit board (PCB) with build-up layers. Substrate 113 can include one or more connectors for connecting substrate 113 to a neighboring substrate (not shown in FIG. 1A). Substrate 113 can include features (not shown) that provide electrical signal communication within substrate 113.

Memory die 111-1, as shown in FIG. 1A, can include a first surface (face surface) 112-1 and a second surface 114-1. A non-face surface 114-1 of memory die 111-1 can be attached, at 123, to a surface 116 of substrate 113. Memory die 111-1 can include bond pad 115-1 on a first surface, e.g., face surface 112-1. Bond pad 115-1 can contain or be processed with a solderball array of contacts on top of bond pad 115-1, e.g. to solderball 117-1. The solderball array can be formed by dropping a solder ball (e.g., solderball 117-1) onto a bond pad, e.g., bond pad 115-1 of a memory die during wafer processing. The wafer can be singulated into the memory dies on a film frame.

Solderball 117-1 can be wirebonded to wire 119 having a first end 122 and a second end 124. Wire 119 can connect memory die 111-1 to substrate 113 at electrical contact point 120. The wirebonding of solderball 117-1 to wire 119 can include formation of a solid joint, e.g., wirebond 121-1 between a first end 122 of wire 119 and solderball 117-1 can be formed using a reflow process to form intermetallics between the wirebond 121-1 and solderball 117-1. That is, the wirebond takes a reflow profile. For example, intermetallic can refer to solid-state phases of metals with a more ordered structure than an alloy and can have a fixed stoichiometry. In intermetallic compounds (that form intermetallic layers), different metals are ordered into different locations. In some examples, wirebond parameters can include using a bondsite temperature of 150° C. A current of approximately 75 mA can be used. A pressure of 25-30 g Force can be used to press a solderball against a wire during a reflow process. A wire type can include a 20.0 µm 4N gold (Au) wire. The indication of 4N can indicate that a material is 99.99% pure gold. In some examples, a gold (Au) ball can be attached to a Tin-Silver-Copper (SnAgCu) solder bump (referred to herein as a SAC solder bump) prior to a reflow process. A wire (e.g., wire 119) can be welded with a gold (Au) ball to the SAC solder bump, where the SAC solder bump is attached to a bond pad (e.g., bond pad 115-1). A wire can also be wedge bonded to the SAC solder bump.

Memory die 111-2 can be attached to memory die 111-1 in a face-to-face configuration. That is, a face surface of memory die 111-2 can be attached to a face surface of memory die 111-1. Memory die 111-2 can include a face surface 112-2 and a non-face surface 114-2. The memory die 111-2 can be attached to memory die 111-1 in a flip-chip fashion, where face surface 112-2 faces downward toward face surface 112-1. Flip-chip can refer to the process of flipping a memory die (e.g., chip), such as memory die 111-2, where a face surface of memory die 111-2 faces down and toward a face surface of memory die 111-1. A support (e.g., an outrigger, not illustrated) can be included between memory dies 111-1 and 111-2 to add stability to wire 119 and/or attachment of memory dies 111-1 and 111-2.

A flip chip process can include metalizing bond pads (e.g., bond pad 115-2) of a chip (e.g., memory die 111-2) to be more receptive to solder. A small amount (e.g., a dot) of solder (e.g., a solderball 117-2) can be placed on and attached to each metallized bond pad. When attaching the flip chip (e.g., memory die with metallized bond pad) into a circuit (e.g., attach to another memory die such as memory die 111-1), the flip chip is inverted (e.g., a face surface of memory die 111-2 is facing down toward a face surface of memory die 111-1 that is facing up). The inverted flip chip includes a solderball (e.g., solderball 117-2) that is brought onto connectors of the memory die already attached to the substrate (e.g., substrate 113). The solderball can be re-melted to produce an electrical connection (e.g., a reflow solder process). A reflow solder process can include using a solder paste (e.g., a mixture of powdered solder and flux) to temporarily attach at least one electrical component to a bond pad. Subsequently, a die assembly is subjected to controlled heat and the solder is melted, connecting the soldered joints.

A memory die (e.g., memory die 111-2) that is flipped onto another memory die (e.g., memory die 111-1) can be attached using a reflow process. For example, a reflow process can include wirebonding, at 121-2, solderball 117-2 to wire 119. That is, memory die 111-1 can be connected to substrate 113 through bond pad 115-1, solderball 117-1, and wire 1119 as well as memory die 111-2 being connected to substrate 113 through bond pad 115-2, solderball 117-2, and wire 119. That is, wire 119 is wirebonded to solderball 117-1 and solderball 117-2 in order to connect both memory die 111-1 and memory die 111-2 to the substrate 113 in a face-to-face configuration. A wire (e.g., wire 119) can be wirebonded to a solderball (e.g., solderball 117-1) using an intermetallic layer between the wire and solder of the solderball.

Memory die 111-1 and memory die 111-2 can be connected to substrate 113 without using a redistributed layer (RDL). RDL can refer to an extra metal layer on a chip that helps an I/O pad (e.g., bond pad) of an integrated circuitry (IC) connect to additional elements of the chip (e.g., substrate 113). An RDL can enable bonding out from a number of locations on the chip in order to bond chip-to-chip. An RDL can move bond pads for wire bonded scenarios from the center of the edge of a die to an outer edge of the die while still in wafer form. An RDL can distribute contact points across the die.

The elements of a semiconductor die assembly (e.g., semiconductor die assembly 101) can be made up of a number of materials. For example, a wire can be made of at least one of gold (Au), silver (Ag), and copper (Cu), or any combination alloy thereof. A solderball (e.g., solderball 117-1) can be made of a Tin-Silver-Copper (SnAgCu) combination (e.g., referred to as a SAC-305 solderball), or a 3-, 4-, or more alloy composition.

In at least one example (illustrated in FIG. 1A), a first method to connect at least two memory dies to a substrate can include preforming a solderball drop or electroplate a solderball onto a wafer. The method can include singulating the wafer to create a first memory die 111-1). The first memory die 111-1 can be attached face up (e.g., face surface 112-2 facing up) to a surface 116 of the substrate 113. The solderball 117-1 of the first memory die can be wirebonded out to the substrate 113 (e.g., a wire bonded to the solderball and to the substrate). A second memory die 111-2 can be flipped and connected to the first memory die 111-1 in a face-to-face configuration. That is, the second memory die 111-2 can be flipped, dipped in flux, aligned with the first memory die 111-1, and placed on the first memory die 111-1 face down (e.g., surface 112-2 facing down). The first memory die 111-1 and the second memory die 111-2 stacked on top of each other in a face-to-face configuration can be reflowed (e.g., connect soldered joints).

The semiconductor die assembly (including the first memory die 111-1 and the second memory die 111-2) can be underfilled. That is, an electrically-insulating adhesive is "underfilled" in a space between the semiconductor die assembly's circuitry and underlying mounting to provide a stronger mechanical connection to ensure solder joints are not stressed due to mechanical stress from bending, dropping, long-term evolution (LTE), etc. of the semiconductor die assembly and surrounding elements. The underfill 126 can distribute a possible thermal expansion mismatch and prevent stress concentration in solder joints. The method can include encapsulating which refers to a surrounding block of semiconducting material being encased in a supporting case (e.g., package) to prevent physical damage and corrosion. The supporting case can support electrical contacts which connect a semiconductor device to a circuit board.

As illustrated in FIG. 1A, a portion 127 of the semiconductor die assembly has different compositions based on whether it is pre-reflow or post-reflow. Portion 127 is illustrated in a pre-reflow process state. That is, the wire 119, solderball 117-1 and solderball 117-2 are illustrated as distinctly separate from each other. As illustrated in FIG. 1B, portion 127 is in a post-reflow state. That is, solderballs 117-1 and 117-2 have been partially combined with wire 119 to form a mixture of compositions 132, 134, and 136. Mixture 132 is indicative of a state of solderball 117-1 post-reflow. Mixture 136 is indicative of a state of solderball 117-2 post-reflow. Mixture 134 is indicative of a state of wire 119 post-reflow. Mixture 134 includes a mixture of compositions of an elemental makeup of solderball 117-1, solderball 117-2, and wire 119. That is, when solderball 117-1 is composed of silver, solderball 117-2 is composed of silver, and wire 119 is composed of gold, mixture 134 will be a mixture of silver and gold. Mixtures 132 and 136 will be a mixture of compositions with a higher degree of whatever elemental makeup solderball 117-1 and solderball 117-2 are composed of Interface 140 at post-reflow indicates an interface created by a reflow process between solderball 117-2 and wire 119. Interface 142 at post-reflow indicate an interface created by a reflow process between solderball 117-1 and wire 119. Interface 140 will have a varying degree of elemental makeups of solderball 117-2 and wire 119. Interface 142 will have a varying degree of elemental makes up of solderball 117-1 and wire 119.

FIG. 2 is an example of a semiconductor die assembly 203 in accordance with a number of embodiments of the present disclosure. In this example, memory die 211-1 and memory die 211-2 are connected to a surface 216 of substrate 213. The second surface 214-1 of a first memory die 211-1 can be adhered, illustrated at 223, to a surface 216 of substrate 213. First memory die 211-1 can be adhered to substrate 213 using a die attach adhesive. Memory die 211-1 has a first (e.g., face) surface 212-1 and a second (e.g., non-face) surface 214-1. Memory die 211-2 has a first (e.g., face) surface 212-2 and a second (e.g., non-face) surface 214-2 Memory die 211-1 is wirebonded out to substrate 213. That is, wire 219 is connected (e.g., wirebonded), at 221-1, to bond pad 215-1 (without an intervening solderball) at a first end 222. Wire 219 can connect memory die 211-1 to substrate 213 at electrical contact point 220. Memory die 211-2 can be flipped and connected to wire 219 using an intervening solderball (e.g., solderball 217). That is, memory die 211-2 can be flipped and solderball 217, which is connected to bond pad 215-2, can be wirebonded, at 221-2, to wire 219 at a first end 222 of wire 219. In this way, memory die 211-1 and memory die 211-2 can be connected to substrate 213 at an electrical contact point 220 in a face-to-face configuration.

FIG. 1A illustrates a wire (e.g., wire 119) wirebonded between two solderballs (e.g., solderball 117-1 and 117-2). FIG. 2 illustrates memory die 211-1 having a wire 219 wirebonded at a first end 222 directly to bond pad 215-1 of a first surface 212-1 of first memory die 211-1, without use of a solderball, and out through a second end 224 to substrate 213). As illustrated in FIG. 2, an additional memory die (e.g., memory die 211-2) uses a solderball (e.g., solderball 217) to be soldered to wire 219 at first end 222. However, examples are not so limited.

A memory die (e.g., memory die 211-1) can be wirebonded out to a substrate (e.g., substrate 213) and an additional memory die (e.g., memory die 211-2) can use an interconnect structure (e.g., a gold stud bump, a copper (Cu) pillar) etc.) instead of solderball 217 to connect to a wire (e.g., wire 219). Wire 219 can be a gold wire and therefore a gold to gold interconnect would be formed. The gold stud bump can be connected to a corresponding bond pad (e.g., bond pad 215-2).

In at least one example, a second method to connect at least two memory dies to a substrate can include preforming a solder ball drop or electroplate a solderball of a second memory die 211-2 (e.g., memory die 211-2 that is attached, illustrated at 221-2 as solderball 217 attached to wire 219, with surface 212-2 face down to a memory die 211-1 whose surface 212-1 is face up) onto a wafer. The method can include singulating the wafer to create the second memory die 211-2. A first memory die 211-1 can be attached face up (e.g., face 212-1 up) on the substrate 213. The first memory die 211-1 can be wirebonded out to the substrate 213 (e.g., a wire bonded to the first memory die 211-1 and the substrate without an intervening solderball to connect the first memory die and the substrate). A second memory die 211-2, including a solderball 217, can be flipped and connected to the first memory die 211-1 in a face-to-face configuration. That is, the second memory die 211-2 can be flipped, dipped in flux, aligned with the first memory die 211-1, and placed on the first memory die 211-1 face surface 212-2 down. The first memory die 211-1 and the second memory die 211-2 stacked on top of each other in a face-to-face configuration can be reflowed (e.g., connect soldered joints).

The semiconductor die assembly (including the first memory die and the second memory die) can be underfilled. That is, an electrically-insulating adhesive is "underfilled" in a space between the semiconductor die assembly's circuitry and underlying mounting to provide a stronger mechanical connection to ensure solder joints are not stressed due to mechanical stress of the semiconductor die assembly and surrounding elements. The underfill can distribute a possible thermal expansion mismatch and prevent stress concentration in solder joints. The method can include encapsulating which refers to a surrounding block of semiconducting material being encased in a supporting case (e.g., package) to prevent physical damage and corrosion. The supporting case can support electrical contacts which connect a semiconductor device to a circuit board.

In at least one example, a third method to connect at least two memory dies (e.g., memory dies 111-1 to 111-2 and 211-1 to 211-2) to a substrate (e.g., substrate) can include attaching a metal stud bump (e.g., Au, Cu, Ag, alloy, etc., not illustrated) to a bond pad of a wafer (e.g., a wafer that will be created into a second memory die 211-2 that has a surface face 212-2 down). The method can include singulating the wafer to create the second memory die. A first memory die can be attached face up on the substrate. The first memory die can be wirebonded out to the substrate (e.g., a wire bonded to the first memory die without a solderball and the substrate to connect the first memory die and the substrate). A second memory die, including the metal (e.g., Au, Cu, Ag, alloy, etc.) stud bump, can be flipped and connected to the first memory die in a face-to-face configuration. That is, ultra sonic force can be used to form a gold to gold interconnect between the gold wire and the gold stud bump. The first memory die and the second memory die are stacked on top of each other in a face-to-face configuration.

The semiconductor die assembly (including the first memory die and the second memory die) in this third method can be underfilled. That is, an electrically-insulating adhesive is "underfilled" in a space between the semiconductor die assembly's circuitry and underlying mounting to provide a stronger mechanical connection to ensure solder joints are not stressed due to mechanical stress of the semiconductor die assembly and surrounding elements. The underfill 226 can distribute a possible thermal expansion mismatch and prevent stress concentration in solder joints. The method can include encapsulating which refers to a tiny block of semiconducting material being encased in a supporting case (e.g., package) to prevent physical damage and corrosion. The supporting case can support electrical contacts which connect a semiconductor device to a circuit board.

FIG. 3 is an example of a semiconductor die assembly 305 in accordance with a number of embodiments of the present disclosure. A number of memory dies 311-1, 311-2, 311-3, 311-4 can be connected, in a stacked fashion, to substrate 313. A first memory die 311-1 can include a first surface (referred to as a "face" surface) 312-1 and a second surface (referred to herein as a "non-face" surface) 314-1. The second surface 314-1 of a first memory die 311-1 can be adhered, illustrated at 323-1, to a surface 316 of substrate 313. First memory die 311-1 can be adhered to substrate 313 using a die attach adhesive. The first surface 312-1 of first memory die 311-1 can include bond pad 315-1, which is wirebonded, as illustrated at 321-1, to a first end 322-1 of wire 319-1. The wirebond 321-1 can connect bond pad 315-1 to substrate 313 by a connection of the wire 319-1 at a second end 324-1 of wire 319-1 connecting to electrical contact point 320 of substrate 313.

A second memory die 311-2 can include a first surface (e.g., face surface) 312-2 and a second surface (e.g., non-face surface) 314-2. The first surface 312-2 can include bond pad 315-2 which is connected to solderball 317-1. Solderball 317-1 can be bonded, as illustrated at 321-2, to a first end 322-1 of wire 319-1. The second memory die 311-2 can be connected to substrate 313 by connecting a first end 322-1 of wire 319-1 at wirebond 321-2 to solderball 317-1 and a second end 324-1 of wire 319-1 to electrical contact point 320 in substrate 313. Second memory die 311-2 can be connected to memory die 311-1 through wire 319-1 using a flip-chip process, as described above.

A third memory die 311-3 can include a second surface (e.g., non-face surface) 314-3 that can be adhered to the second surface 314-2 of second memory die 311-2, as illustrated at 323-2, using a die attach adhesive. Third memory die 311-3 can include bond pad 315-3 on a first surface (e.g., face surface) 312-3 of third memory die 311-3, which is connected, as illustrated at 321-3, to a first end 322-2 of wire 319-2. The first end 322-2 of wire 319-2 connects to bond pad 315-3 and second end 324-2 of wire 319-2 connects to electrical contact point 320 of substrate 313 which connects the third memory die 311-3 to substrate 313.

Fourth memory die 311-4 can include bond pad 315-4 on a first surface (e.g., face surface) 312-4. Memory die 311-4 can include a second surface (e.g., non-face surface) 314-4. The bond pad 315-4 can be connected to solderball 317-2. Solderball 317-2 can be bonded, as illustrated at 321-4, to a first end 322-2 of wire 319-2. The wirebond 321-4 can connect solderball 317-2 and wire 319-2 at a first end 322-2 of wire 319-2. The wire 319-2 can connect the bond pad 315-4 to substrate 313 by a connection at a second end 324-2 of wire 319-2 connecting to electrical contact point 320 of substrate 313. Therefore, a first memory die 311-1 and a second memory die 311-2 can be connected in a face-to-face configuration to each other and also attached to a third memory die 311-3 and a fourth memory die 311-4 that is in a face-to-face configuration to each other. While four memory dies, configured in a stacked fashion, are illustrated in FIG. 3, examples are not so limited. Any number of memory dies can be stacked and connected through a corresponding number of wires to a substrate. Underfill 326 can distribute a possible thermal expansion mismatch and prevent stress concentration in solder joints between memory dies 311-1 and 311-2 and 311-3 and 311-4, along with space alongside (as illustrated in FIG. 3) memory dies 311-1 to 311-4.

Figure 4:
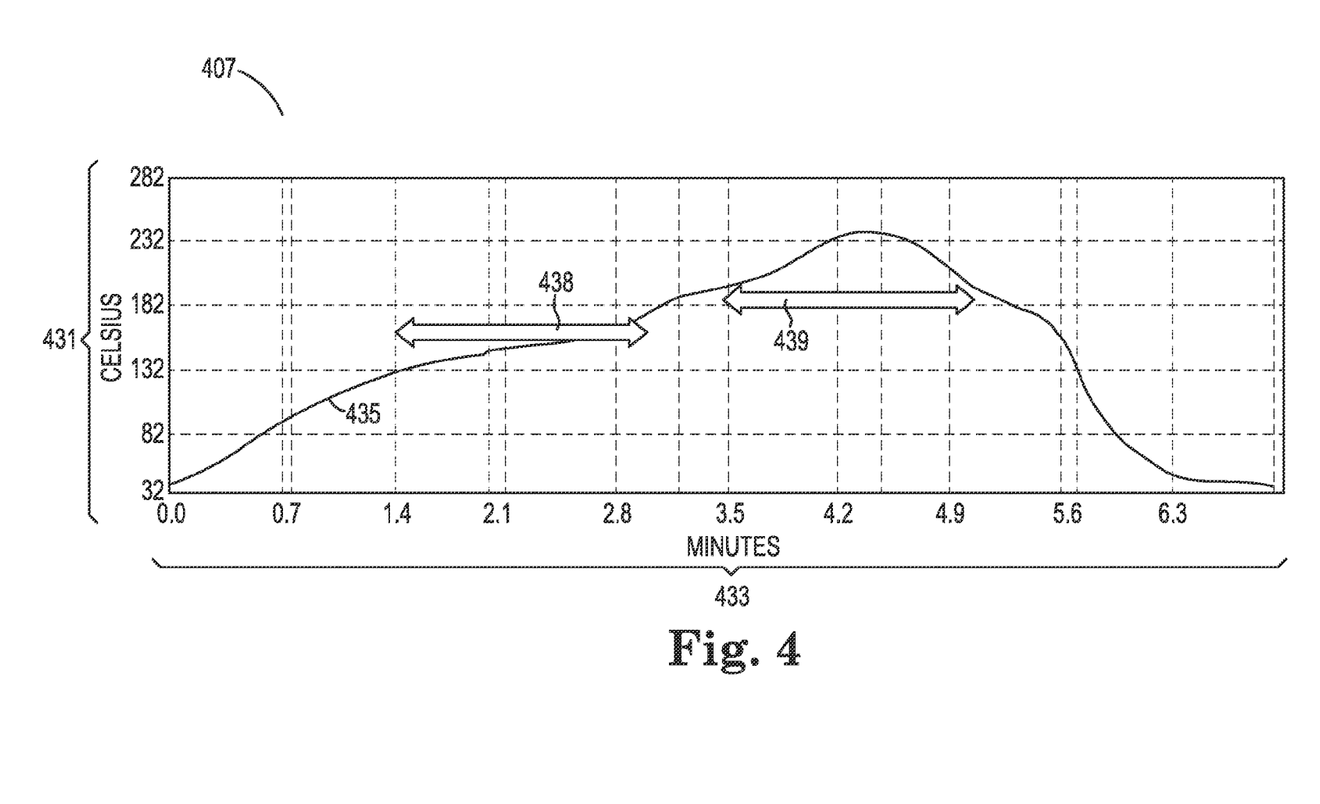
FIG. 4 is an example of a graph in accordance with a number of embodiments of the present disclosure.

FIG. 4 is an example of a graph 407 in accordance with a number of embodiments of the present disclosure. Graph 407 is an illustrated example of a reflow profile. Graph 407 can include a temperature (in Celsius) 431, along the y-axis of graph 407 and a time interval (in minutes) 433 along the x-axis. A line 435 can be an indication of a temperature 431 of the example reflow process during a time interval 433. For example, at time 1.4 minutes, the reflow process can be at a temperature of 132 degrees Celsius, as illustrated by graph 407. Time interval 438 indicates a flux soak zone for the reflow process. The flux soak zone refers to a period when the flux removes metal oxides and burns the metal oxides away. Time interval 439 is an interval of time when a peak temperature (e.g. a temperature between 245-260 degrees Celsius) is reached. At an end of time interval 439, a time above liquidus (e.g., approximately 220 Celsius pending a tin-silver-copper composition). Time interval 439 is targeted to occur for approximately 45 seconds and can range from 30 to 60 seconds.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A semiconductor die assembly, comprising:
   an interconnect structure comprised of a first type of metal attached to a bond pad on a face surface of a memory die;
   a non-face surface of the memory die attached to a substrate; and
   a wire comprised of a second type of metal wirebonded to the interconnect structure at a first end of the wire to form a reflowed intermetallic layer and connected to the substrate at a second end of the wire.

2. The semiconductor die assembly of claim 1, comprising an additional memory die, wherein the additional memory die comprises:
   an additional bond pad; and
   an additional interconnect structure bonded to the first end of the wire.

3. The semiconductor die assembly of claim 2, wherein the memory die and the additional memory die are configured in a face-to-face configuration.

4. The semiconductor die assembly of claim 3, wherein an interface between the face surface of the memory die and a face surface of the additional memory die does not include a redistributed layer (RDL).

5. The semiconductor die assembly of claim 1, wherein the wire is wirebonded to the bond pad of an additional memory die and the interconnect structure is wirebonded to the wire.

6. The semiconductor die assembly of claim 1, wherein the wire is at least one of a gold wire, a silver wire, a copper wire, and an alloy composition of at least two of gold, silver, and copper.

7. The semiconductor die assembly of claim 1, wherein the wire is wirebonded to the interconnect structure using an intermetallic layer between the wire and solder of the interconnect structure.

8. The semiconductor die assembly of claim 1, wherein the wire is comprised of gold (Au) and the interconnect structure is comprised of tin (Sn), silver (Ag), and copper (Cu).

9. A semiconductor die assembly, comprising:
   a first memory die including a first bond pad wirebonded to a wire comprised of a first type of metal;
   a second memory die including a second bond pad connected to an interconnect structure comprised of a second type of metal to form a reflowed intermetallic layer; and
   a substrate;
   wherein the interconnect structure is bonded to the wire and the wire is connected to the substrate.

10. The semiconductor die assembly of claim 9, wherein the first memory die and the second memory die are in a face-to-face configuration.

11. The semiconductor die assembly of claim 9, wherein an additional interconnect structure is connected to the first bond pad and the additional interconnect structure is bonded to the wire.

12. The semiconductor die assembly of claim 9, wherein the interconnect structure of the second memory die comprises a gold stud bump.

13. The semiconductor die assembly of claim 9, wherein the interconnect structure of the second memory die comprises a solderball.

14. The semiconductor die assembly of claim 13, wherein the solderball comprises an electroplated structure.

15. The semiconductor die assembly of claim 14, wherein the solderball further comprises an intermetallic nickel layer.

16. The semiconductor die assembly of claim 15, wherein the tin-silver layer is wirebonded to the wire.

17. A method, comprising:
   forming a solderball on a face surface of a first memory die;
   wirebonding a first end of a wire to the solderball and a second end of the wire to a substrate, wherein the wire is comprised of a different metal than the solderball and the wire and the solderball form a reflowed intermetallic layer; and
   attaching a second memory die in a flipped orientation such that a face surface of the second memory die faces the face surface of the first memory die.

18. The method of claim 17, wherein the first memory die and the second memory die are connected to the substrate without using a redistributed layer.

19. The method of claim 17, wherein the solderball on the face surface of the first memory die is on a bond pad of the first memory die.

20. The method of claim 17, wherein attaching the second memory die comprises wirebonding a solderball attached to a bond pad on the face surface of the second memory die to the wire.

21. The method of claim 17, comprising attaching a non-face surface of the first memory die to the substrate.

22. The method of claim 17, comprising reflowing the first memory die attached to the second memory die to form an intermetallic layer between the wire and the solderball.

23. The method of claim 17, comprising creating the first memory die by singulating a wafer.

24. The method of claim 23, wherein the solderball is formed on the wafer prior to singulating the wafer to create the first memory die.

25. The method of claim 17, wherein attaching the second memory die to the first memory die comprises:
   flipping the second memory die; and
   dipping the second memory die in flux.

26. The method of claim 25, wherein attaching the second memory die to the first memory die comprises:
   aligning the second memory die in a face-to-face configuration with the first memory die; and
   placing the second memory die onto the first memory die.

27. A method, comprising:
   forming a first solderball on a face surface of a first memory die;
   wirebonding a first end of a first wire to the first solderball and a second end of the first wire to a substrate;
   attaching a second memory die in a flipped orientation such that a face surface of the second memory die faces the face surface of the first memory die;
   forming a second solderball on a face surface of a third memory die;
   wirebonding a first end of a second wire to the second solderball and a second end of the second wire to the substrate; and
   attaching a fourth memory die in a flipped orientation with respect to the third memory die such that a face surface of the fourth memory die faces the face surface of the third memory die; and reflowing the first memory die, the second memory die, the third memory die, and the fourth memory die such that the first wire and the first solderball form a first reflowed intermetallic layer and the second wire and the second solderball form a second reflowed intermetallic layer.

\* \* \* \* \*